(12) United States Patent
Chan et al.

(10) Patent No.: US 8,618,641 B2
(45) Date of Patent: Dec. 31, 2013

(54) LEADFRAME-BASED SEMICONDUCTOR PACKAGE

(75) Inventors: Chang-Yueh Chan, Taichung (TW);
Chih-Ming Huang, Taichung (TW);
Chun-Yuan Li, Taichung (TW);
Chih-Hsin Lai, Taichung (TW)

(73) Assignee: Siliconware Precision Industries Co., Ltd, Taichung (TW)

( * ) Notice: Subject to any disclaimer, the term of this patent is extended or adjusted under 35 U.S.C. 154(b) by 452 days.

(21) Appl. No.: 12/228,379

(22) Filed: Aug. 11, 2008

(65) Prior Publication Data

US 2009/0039488 A1 Feb. 12, 2009

(30) Foreign Application Priority Data

Aug. 10, 2007 (TW) .............................. 96129512 A

(51) Int. Cl.
*H01L 23/495* (2006.01)
(52) U.S. Cl.
USPC .............. 257/676; 257/E23.037; 257/E21.51; 43/123
(58) Field of Classification Search
USPC .................. 257/675, 690, 693, 676, E23.037, 257/E21.51; 438/123
See application file for complete search history.

(56) References Cited

U.S. PATENT DOCUMENTS

| | | | |
|---|---|---|---|
| 4,763,188 A | 8/1988 | Johnson | |
| 5,283,717 A | 2/1994 | Hundt | |
| 5,365,409 A | 11/1994 | Kwon et al. | |
| 5,386,141 A | 1/1995 | Liang et al. | |
| 5,420,758 A | 5/1995 | Liang | |
| 5,438,478 A | 8/1995 | Kondo et al. | |
| 5,440,169 A * | 8/1995 | Tomita et al. | 257/667 |
| 5,502,289 A | 3/1996 | Takiar et al. | |
| 5,508,556 A * | 4/1996 | Lin | 257/691 |
| 5,708,567 A * | 1/1998 | Shim et al. | 361/723 |
| 5,854,512 A | 12/1998 | Manteghi | |
| 6,093,960 A * | 7/2000 | Tao et al. | 257/706 |
| 6,483,187 B1 * | 11/2002 | Chao et al. | 257/712 |
| 6,713,864 B1 * | 3/2004 | Huang | 257/712 |
| 6,784,530 B2 * | 8/2004 | Sugaya et al. | 257/686 |
| 6,831,352 B1 * | 12/2004 | Tsai | 257/666 |
| 6,876,068 B1 | 4/2005 | Lee et al. | |
| 6,906,414 B2 * | 6/2005 | Zhao et al. | 257/707 |
| 7,074,647 B2 * | 7/2006 | Owens et al. | 438/108 |
| 7,122,406 B1 * | 10/2006 | Yilmaz et al. | 438/123 |
| 7,132,314 B2 * | 11/2006 | Matsunami | 438/123 |
| 7,132,753 B1 * | 11/2006 | St. Amand et al. | 257/777 |

(Continued)

*Primary Examiner* — Kimberly Rizkallah
*Assistant Examiner* — Caleb Henry
(74) *Attorney, Agent, or Firm* — Edwards Wildman Palmer LLP; Peter F. Corless; Steven M. Jensen

(57) ABSTRACT

A semiconductor package and a method for fabricating the same are provided. A leadframe including a die pad and a plurality of peripheral leads is provided. A carrier, having a plurality of connecting pads formed thereon, is attached to the die pad, wherein a planar size of the carrier is greater than that of the die pad, allowing the connecting pads on the carrier to be exposed from the die pad. At least a semiconductor chip is attached to a side of an assembly including the die pad and the carrier, and is electrically connected to the connecting pads of the carrier and the leads via bonding wires. A package encapsulant encapsulates the semiconductor chip, the bonding wires, a part of the carrier and a part of the leadframe, allowing a bottom surface of the carrier and a part of the leads to be exposed from the package encapsulant.

28 Claims, 8 Drawing Sheets

(56) References Cited

U.S. PATENT DOCUMENTS

| | | | |
|---|---|---|---|
| 7,166,905 B1* | 1/2007 | Shah | 257/666 |
| 7,245,007 B1* | 7/2007 | Foster | 257/678 |
| 7,357,294 B2* | 4/2008 | Liu et al. | 228/180.21 |
| 2002/0025352 A1* | 2/2002 | Miyajima | 425/89 |
| 2005/0009239 A1* | 1/2005 | Wolff et al. | 438/123 |
| 2005/0017352 A1* | 1/2005 | Lee | 257/728 |
| 2005/0092339 A1* | 5/2005 | Laukala | 132/75 |
| 2005/0253253 A1* | 11/2005 | Chiang et al. | 257/718 |
| 2006/0071351 A1* | 4/2006 | Lange | 257/787 |
| 2006/0261453 A1* | 11/2006 | Lee et al. | 257/676 |
| 2010/0259908 A1* | 10/2010 | Sutardja | 361/760 |

* cited by examiner

LEADFRAME-BASED SEMICONDUCTOR PACKAGE

BACKGROUND OF THE INVENTION

1. Field of the Invention

The present invention relates to semiconductor packages and manufacturing methods thereof, and more specifically, to a leadframe-based semiconductor package with an increased number of electrical input/output (I/O) connections and a manufacturing method thereof.

2. Description of Prior Art

Conventional leadframe semiconductor package, such as a quad flat package (QFP), has a manufacturing method that requires a die pad and a leadframe with a plurality of leads. A semiconductor chip is mounted on a die pad with a plurality of bonding wires electrically connected to the bonding pads of the semiconductor chip and the corresponding plurality of leads. Moreover, a package encapsulant is used to encapsulate the semiconductor chip and the bonding wires to form a leadframe semiconductor package.

The disadvantage of the conventional leadframe semiconductor package is that leads used for electrical input/output pins can only be aligned on the four peripheral sides of the package body, and therefore the number of I/O connections that this structure can provide is limited by the size of the package body. In order to solve the aforementioned problem, the ball grid array semiconductor package was then invented.

Conventional ball grid array (BGA) semiconductor package involves a manufacturing method that uses a substrate with a plurality of trace patterns on top and bottom surfaces. A semiconductor chip is mounted on the top of the substrate and bonding wires are used to interconnect bonding pads of the semiconductor chip and ends of the trace pattern on the top side of the substrate. Then, through the routing circuits internal to the substrate and the vias, the trace pattern on the top of the substrate is electrically connected to the trace pattern on the bottom of the substrate. The goal is to mount a solder ball on a solder ball pad, which is terminated by ends of the trace pattern on the bottom of the substrate. The solder ball electrically connects the semiconductor chip to the external device. More I/O connections can be obtained by I/O assignment on the whole substrate surface.

The fabrication process of the trace pattern on the top substrate surface, the internal conductive structures of the substrate and the trace layout on the bottom substrate surface is complicated and of a high cost for such a ball grid array semiconductor package, therefore such package structure is only capable of providing high density of I/O connections but has the drawback of high cost. Consequently, it is unable to satisfy the requirements of low cost and high I/O density in the industry.

For further information, referring to FIG. 1, a semiconductor package that combines the ball-grid array substrate and the leads is disclosed in U.S. Pat. No. 5,854,512. This semiconductor package is capable of providing a higher density of I/O connections, as it mainly provides a substrate 11 with a first trace pattern 11 and a second trace pattern 112 laid on the respective top and bottom surfaces. In addition, the first trace pattern 111 on the surface of the substrate 11 is attached with a plurality of leads 12 of a leadframe by using a non-conductive adhesive. A semiconductor chip 13 is placed on the top surface of the substrate 11 thereby allowing the semiconductor chip 13 to be electrically connected to a bonding finger 1110 of the first trace pattern 111 and the leads 12 via bonding wires 14. Subsequently, form, on the substrate 11, a package encapsulant that encapsulates the semiconductor chip 13 and the bonding wires 14. On the substrate 11, the solder ball pad 1120 fixed on the second trace pattern 112 is mounted with the solder ball 16 and the leads 12 are bent, forming a ball-grid array semiconductor package that has leads. Additional I/O connection counts are provided via installation of the leads. Relevant technology content may be referred to U.S. Pat. Nos. 4,763,188 5,420,758 5,365,409 5,438,478 5,386,141 5,283,717 and 5,502,289.

However, the cost of the conventional ball-grid array (BGA) semiconductor package process is still too high and not accepted by the industry.

Referring to FIGS. 2A and 2E, U.S. Pat. No. 6,876,068 discloses an inexpensive BGA substrate structure to increase the electrical I/O connections on the leadframe semiconductor package and its manufacturing method. The leadframe semiconductor package provides a leadframe 22 which comprises a die pad 220, a plurality of first leads 221 attached to the internal peripheral of the die pad 220, and a plurality of second leads 222 attached, but spaced by a distance, to the external peripheral of the die pad 220, wherein the first leads 221 form a spaced open slot 2210 with a first supporting bar 2211 attached to the first leads, and the second leads 222 has a second supporting bar 2221 attached to it (as shown in FIGS. 2A and 2B, wherein FIG. 2B is a cross-sectional view of FIG. 2A); a semiconductor chip 23 is placed on the die pad 220 and the chip is electrically connected to the first leads 221 and the second leads 222 via a plurality of bonding wire 24 (as depicted in FIG. 2C). A package encapsulant 25 is formed to encapsulate the semiconductor chip 23, the die pad 220, the first leads 221 and partial second leads 222 to allow the bottom surface of the die pad 220, the bottom surface of the first leads 221 and the external part of the second leads 222 to be exposed outside of the package encapsulant 25 (as shown in FIG. 2D). Subsequently etching or cutting will be applied to the first supporting bar 2211 to separate the first leads 221 and separate the second leads 222; the second leads 222 is additionally bent. Installation of the first leads 221 will increase the number of usable electrical I/O connections on the package structure.

However, the aforementioned process requires etching or cutting to separate the first leads, the process is not only complicated but also costly. Also the etched or cut part of the first leads can be easily broken and attacked by moisture due to insufficient encapsulating of the package encapsulant. In addition, the cross-sectional surface of the etched or cut part of the first leads can be easily oxidized, thus when the surface mount technology (SMT) is used to solder the packaged component onto the external device in the future, wetting of the tin will be ineffective, leading to defected soldering. Besides, when the arrangement of the first leads is of a high density, package molding can easily cause the electrical connection contacts of the bottom surface of the first leads to be encapsulated by resin flash of the package encapsulant during the package molding process, thereby requiring an additional undesired encapsulant removal process.

Therefore, a way to provide a leadframe semiconductor package that is of a low cost and capable of providing a plurality of additional electrical I/O connections, and its manufacturing method as well as a package structure that can at the same time be exempted from a separation process by etching and cutting, thereby preventing occurrence of cracks, humidification, ineffective wetting, encapsulant flash in the additional electrical I/O connections is the immediate subject that concerns the relevant industry.

SUMMARY OF THE INVENTION

In view of the above drawbacks in the conventional technology, an objective of the present invention is to provide a low-cost semiconductor package having a plurality of additional electrical I/O connections and a manufacturing method of the semiconductor package.

Another objective of the present invention is to provide a semiconductor package and a manufacturing method thereof, without the need of performing a separation process of etching or cutting.

Still another objective of the present invention is to provide a semiconductor package and a manufacturing method thereof, which can prevent cracking of additional electrical I/O connections and moisture invasion.

A further objective of the present invention is to provide a semiconductor package and a manufacturing method thereof, which can prevent ineffective wetting of additional electrical I/O connections.

A further objective of the present invention is to provide a semiconductor package and a manufacturing method thereof, which can prevent resin flash to additional electrical I/O connections.

In order to achieve the aforementioned and other objectives, the present invention provides a manufacturing method of a semiconductor package, comprising the steps of: providing a leadframe and a carrier, with a plurality of connecting pads being formed on the carrier, wherein the leadframe comprises a die pad and a plurality of leads surrounding the die pad, and the die pad is attached to a top surface of the carrier, wherein a planar size of the carrier is larger than that of the die pad, allowing the connecting pads on the top surface of the carrier to be exposed from the die pad; attaching at least a semiconductor chip to a side of an assembly comprising the die pad and the carrier; forming a plurality of bonding wires electrically connecting the semiconductor chip to the connecting pads on the top surface of the carrier and the leads of the leadframe; and forming a package encapsulant encapsulating the semiconductor chip, the bonding wires, a part of the carrier and a part of the leadframe, allowing a bottom surface of the carrier and a part of the leads to be exposed from the package encapsulant. An attaching pad is formed on the top surface of the carrier, allowing the die pad of the leadframe to be attached to the attaching pad. The attaching pad is electrically connected to the connecting pads on the bottom surface of the carrier via conductive structures formed in the carrier.

A distance between the leads of the leadframe and the bottom surface of the carrier is slightly greater than a depth of a cavity of a mold used in forming the package encapsulant. Thereby, during a molding process for forming the package encapsulant, the carrier abuts against a wall of the cavity of the mold so as to prevent resin flash of the package encapsulant.

Further in the present invention, the semiconductor chip may be electrically connected to the die pad of the leadframe or the attaching pad of the carrier via grounding wires, so as to enhance the electrical performance of the semiconductor package. The planar size of the die pad of the leadframe can be made smaller than that of the semiconductor chip, such that the semiconductor chip may be electrically connected to the attaching pad of the carrier via grounding wires. Further, passive components can be mounted on and electrically connected to the connecting pads on the top surface of the carrier so as to enhance the electrical performance of the semiconductor package. Moreover, the leadframe may be a quad flat non-leaded leadframe, such that bottom surfaces of the leads of the quad flat non-leaded leadframe and the bottom surface of the carrier are substantially coplanar with each other and are exposed from the package encapsulant.

The semiconductor chip can be directly attached to the die pad. Alternatively, an opening can be formed in the die pad of the leadframe, allowing the semiconductor chip to be placed in the opening of the die pad and attached to the carrier. The carrier may be covered with a soldermask layer. The soldermask layer is formed a plurality of openings for exposing the connecting pads on the carrier, allowing conductive components to be mounted to the exposed connecting pads, such that the semiconductor package can be electrically connected to an external device via the conductive components.

According to the aforementioned manufacturing method, the present invention provides a semiconductor package, comprising: a leadframe comprising a die pad and a plurality of leads surrounding the die pad, the die pad having a top surface and an opposing bottom surface; a carrier mounted to the bottom surface of the die pad, wherein a plurality of connecting pads are formed on the carrier, and a planar size of the carrier is greater than that of the die pad, allowing the connecting pads on a top surface of the carrier to be exposed from the die pad; at least a semiconductor chip attached to a side of an assembly comprising the die pad and the carrier, and electrically connected to the connecting pads of the carrier and the leads of the leadframe via bonding wires; and a package encapsulant encapsulating the semiconductor chip, the bonding wires, a part of the carrier and a part of the leadframe, allowing a bottom surface of the carrier and a part of the leads to be exposed from the package encapsulant.

Therefore, according to the semiconductor package and the manufacturing method thereof in the present invention, a carrier with a plurality of connecting pads being formed thereon is prepared and is then attached to a bottom surface of a die pad of a leadframe. A planar size of the carrier is larger than that of the die pad, such that the connecting pads of the carrier are exposed. At least a semiconductor chip is attached to a top surface of the die pad, and is electrically connected to the connecting pads of the carrier and the leads of the leadframe via a plurality of bonding wires. Subsequently, a package encapsulant is formed to encapsulate the semiconductor chip, the bonding wires, a part of the carrier and a part of the leadframe, allowing a bottom surface of the carrier and a part of the leads to be exposed from the package encapsulant. In this way, the connecting pads of the carrier can be used to increase electrical input/output (I/O) connections of the chip, without the need of providing additional leads in the die pad as in the conventional technology. Consequently, the undesirable increase in the complexity of fabrication processes due to the need of performing a deflash process for removing resin flash incurred in a molding process as in the conventional technology, can be eliminated in the present invention. Further, the undesirable increase in the complexity of fabrication processes and the fabrication cost due to the need of a separation process for the additional leads as in the conventional technology, can be eliminated in the present invention. Moreover, the degraded bonding in the semiconductor package due to cracks and moisture invading (caused by insufficient encapsulating of the package encapsulant after separation of the additional leads) and due to ineffective wetting of a solder material (caused by oxidation) as in the conventional technology, can be avoided in the present invention.

DETAILED DESCRIPTION OF PREFERRED EMBODIMENTS

Illustrative embodiments of a semiconductor package and a manufacturing method thereof provided in the present invention are described as follows with reference to FIGS. 3 to 9. It should be understood that the drawings are simplified schematic diagrams only showing the components relevant to the present invention, and the layout of components could be more complicated in practical implementation.

First Embodiment

FIGS. 3A to 3E illustrate a semiconductor package and a manufacturing method thereof in accordance with a first embodiment of the present invention.

Figure 1:
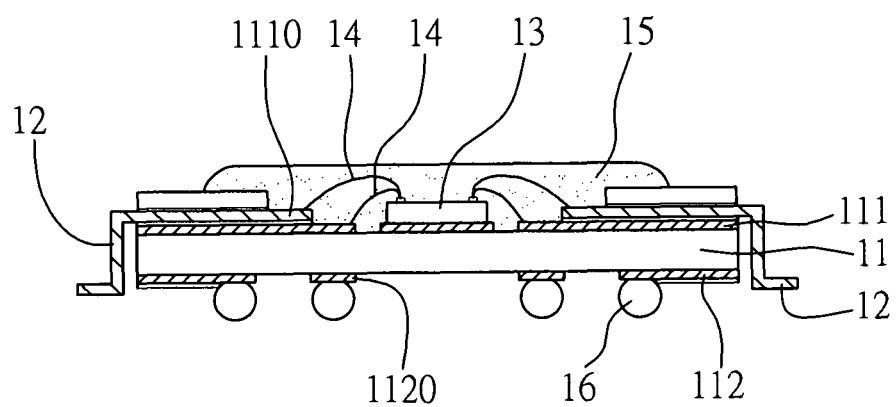
FIG. 1 is a cross-sectional view of a semiconductor package including a ball grid array substrate and leads as disclosed in U.S. Pat. No. 5,854,512.
Figure 2A:
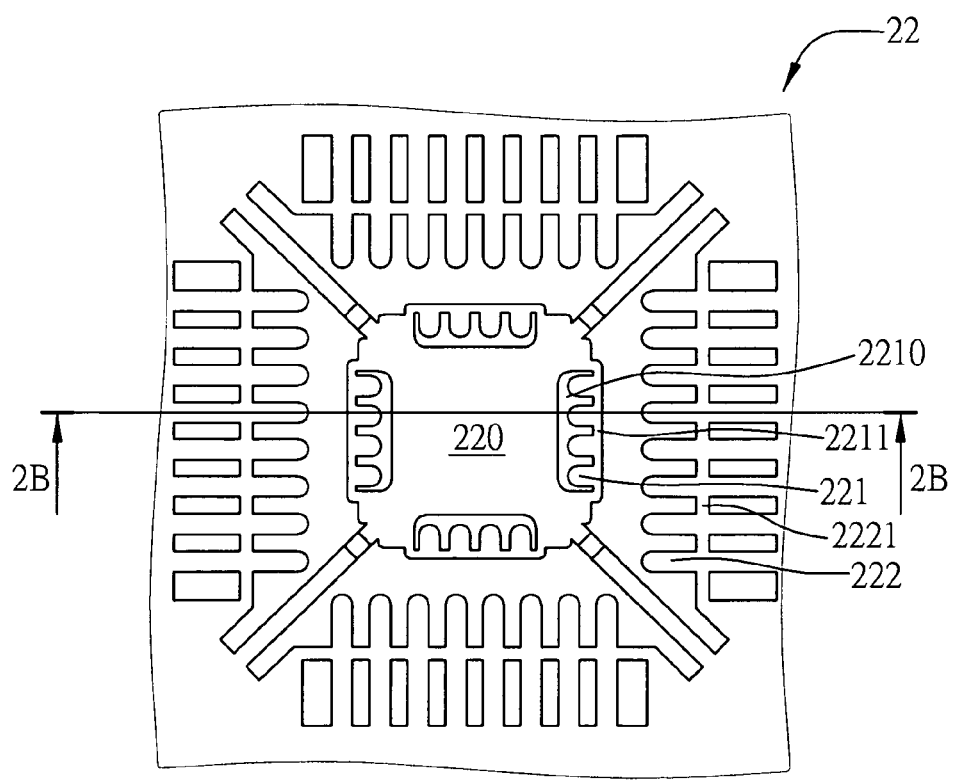
FIGS. 2A to 2E are schematic diagrams illustrating a leadframe-based semiconductor package with increased electrical I/O connections as disclosed in U.S. Pat. No. 6,876,068.
Figure 2B:
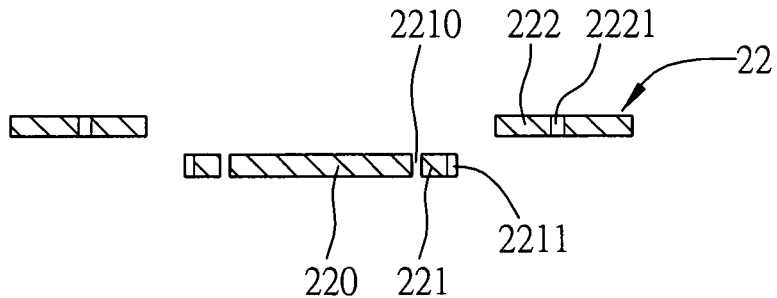
Figure 2C:
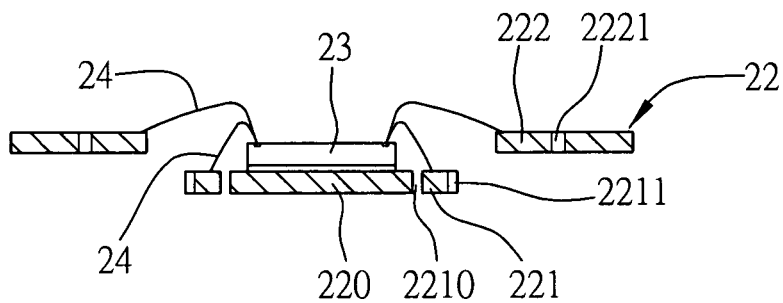
Figure 2D:
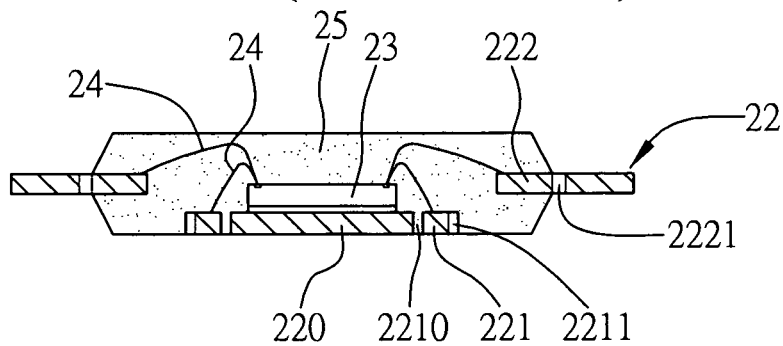
Figure 2E:
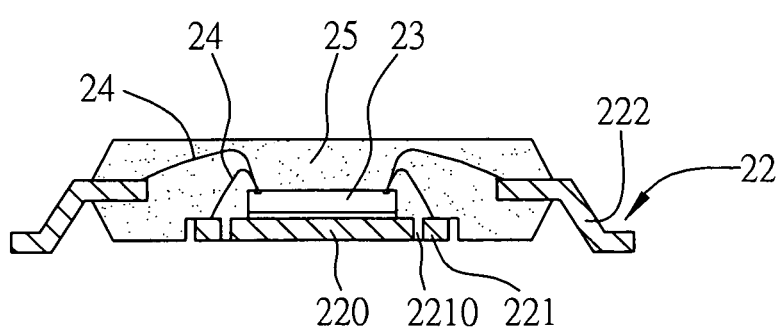
Figure 3A:
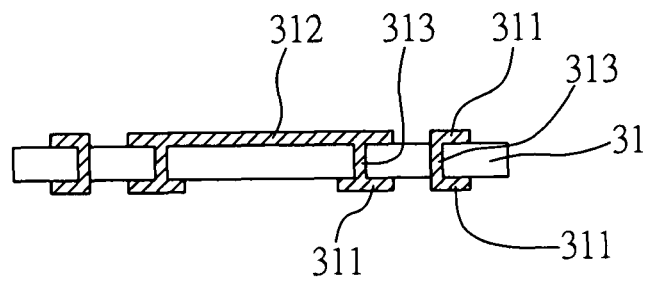
FIGS. 3A to 3E are schematic diagrams showing a semiconductor package and a manufacturing method thereof in accordance with a first embodiment of the present invention.
Figure 3B:
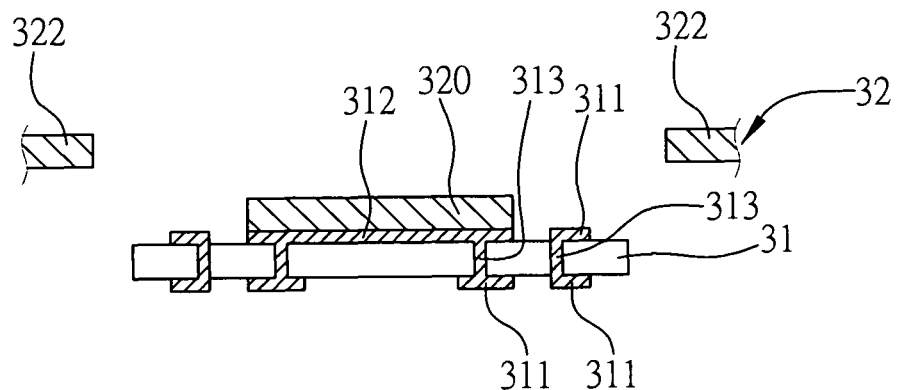

As shown in FIGS. 3A and 3B, first, a leadframe 32, and a carrier 31 with a plurality of connecting pads 311 formed on top and bottom surfaces thereof, are provided. The leadframe 32 includes a die pad 320 and a plurality of leads 322 surrounding the die pad 320. The carrier 31 is attached to a bottom surface of the die pad 320. A planar size of the carrier 31 is larger than that of the die pad 320 so as to allow the connecting pads 311 on the top surface of the carrier 31 to be exposed from the die pad 320.

The connecting pads 311 on the top surface of the carrier 31 are electrically connected to the connecting pads 311 on the bottom surface of the carrier 31 by conductive structures 313 (such as vias) formed in the carrier 31. At least an attaching pad 312 is disposed on the top surface of the carrier 31. The leadframe 32, the attaching pad 312 and the connecting pads 311 are each primarily made of copper and plated with a metal layer (such as a nickel/gold layer) for connecting bonding wires. The die pad 320 of the leadframe 32 is attached to the attaching pad 312 on the top surface of the carrier 31. The attaching pad 312 can be electrically connected to the connecting pad 311 on the bottom surface of the carrier 31 by the conductive structures 313 formed in the carrier 31. In this way, a semiconductor chip (not shown) can be electrically connected to an external device through the die pad 320 of the leadframe 32, the attaching pad 312, the conductive structures 313 and the connecting pads 311. In the present invention, the carrier 31 can be fabricated more easily than the conventional ball grid array (BGA) substrate and does not require complicated circuit design and layout, thereby effectively saving the fabrication cost.

Figure 3C:
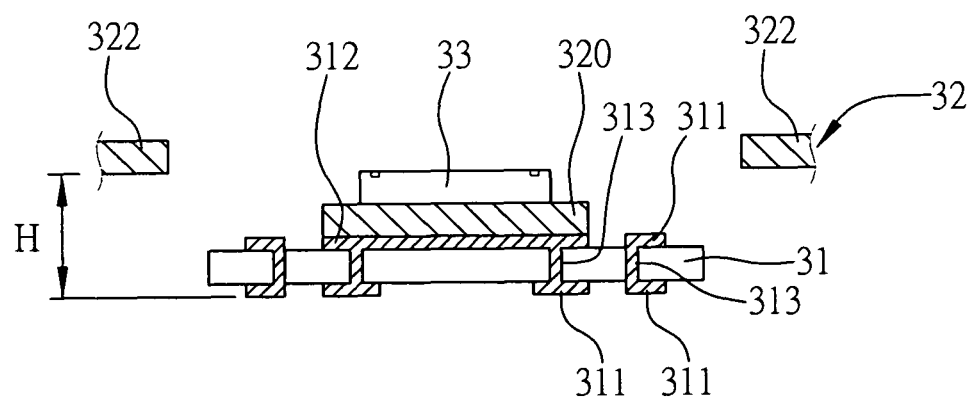
Figure 3D:
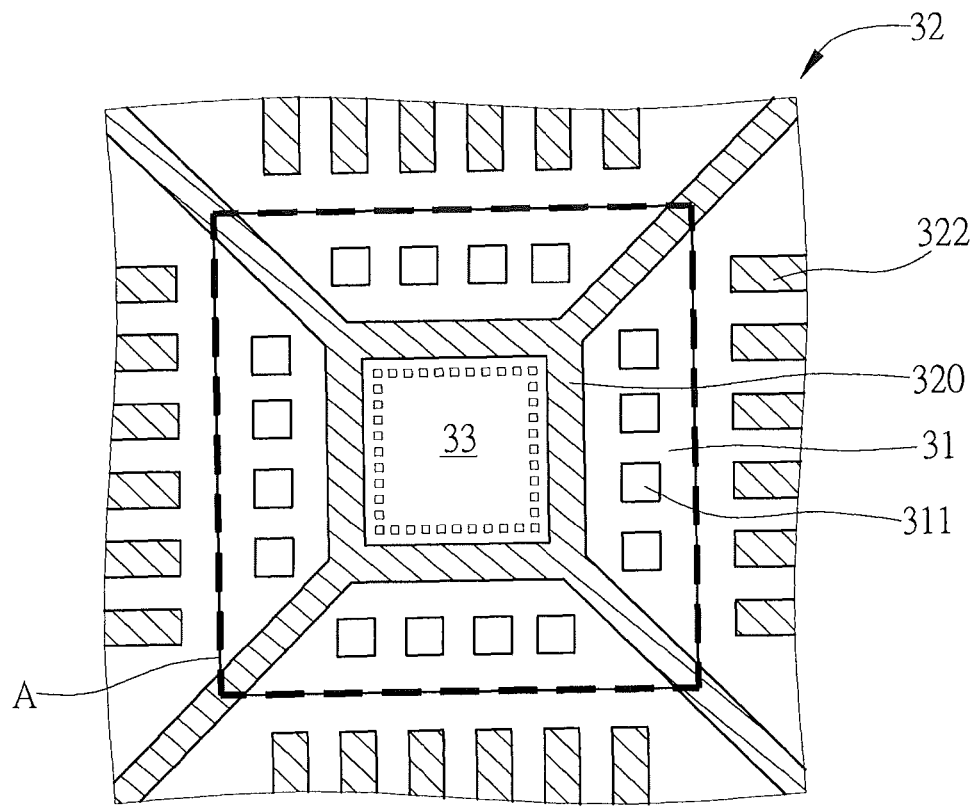
Figure 3E:
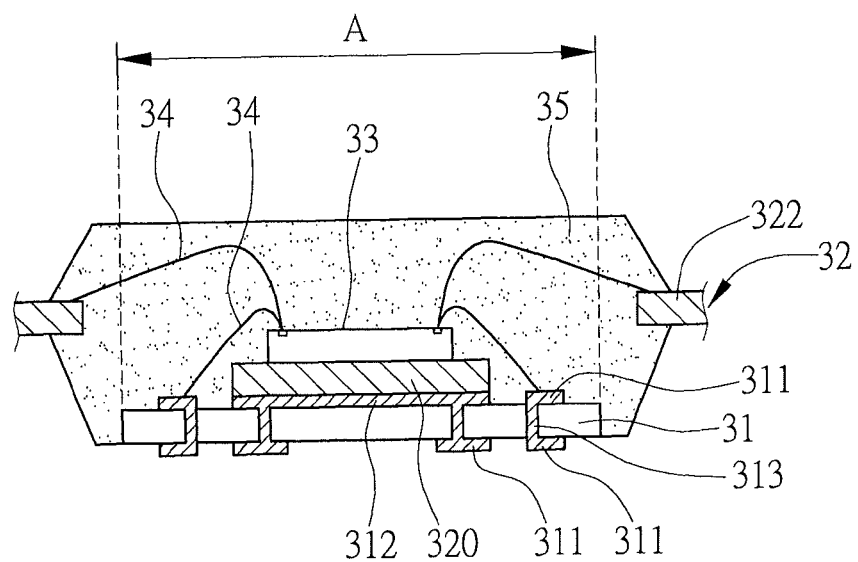

As shown in FIGS. 3C to 3E (FIG. 3D is a top view of FIG. 3C), at least a semiconductor chip 33 is mounted on a top surface of the die pad 320. The semiconductor chip 33 can be attached to the die pad 320 by silver paste (not shown), for example.

Next, a plurality of bonding wires 34 are formed to electrically connect the semiconductor chip 33 to the connecting pads 311 on the top surface of the carrier 31 and the leads 322 of the leadframe 32, the leads 322 being entirely located outside a vertical-forward projected area A of the carrier 31, and free from contacting the carrier 31, as shown in FIGS. 3D and 3E. A molding process is performed to form a package encapsulant 35 for encapsulating the semiconductor chip 33, the bonding wires 34, a part of the carrier 31 and a part of the leadframe 32. In addition, the bottom surface of the carrier 31 and outer portions of the leads 322 are exposed from the package encapsulant 35.

As shown in FIG. 3C, a distance H between bottom surfaces of the leads 322 of the leadframe 32 and the bottom surface of the carrier 31 is slightly larger than a depth of a cavity of a mold (not shown, used in the molding process) by 2 to 8 mils. Thereby, in the molding process, the carrier 31 is allowed to abut against a wall of the cavity of the mold, thereby preventing resin flash during resin injection into the cavity.

In this way, the connecting pads 311 of the carrier 31 can be used to provide additional electrical I/O connections for the semiconductor chip 33.

By the aforementioned manufacturing method, the present invention provides a semiconductor package, including: a leadframe 32 comprising a die pad 320 and a plurality of leads 322 surrounding the die pad 320, the die pad 320 having a top surface and an opposing bottom surface; a carrier 31 attached to the bottom surface of the die pad 320, wherein a plurality of connecting pads 311 are formed on the carrier 31, and a planar size of the carrier 31 is larger than that of the die pad 320, allowing the connecting pads 311 on a top surface of the carrier 31 to be exposed from the die pad 320; at least a semiconductor chip 33 attached to the top surface of the die pad 320, and electrically connected to the connecting pads 311 of the carrier 31 and the leads 322 of the leadframe 32 via a plurality of bonding wires 34; a package encapsulant 35 encapsulating the semiconductor chip 33, the bonding wires 34, a part of the carrier 31 and a part of the leadframe 32, allowing the bottom surface of the carrier 31 and outer portions of the leads 322 to exposed from the package encapsulant 35.

Therefore, according to the semiconductor package and the manufacturing method thereof in the present invention, a carrier with a plurality of connecting pads being formed thereon is prepared and is then attached to a bottom surface of a die pad of a leadframe. A planar size of the carrier is larger than that of the die pad, such that the connecting pads of the carrier are exposed. At least a semiconductor chip is attached to a top surface of the die pad, and is electrically connected to the connecting pads of the carrier and the leads of the leadframe via a plurality of bonding wires. Subsequently, a package encapsulant is formed to encapsulate the semiconductor chip, the bonding wires, a part of the carrier and a part of the leadframe, allowing a bottom surface of the carrier and a part of the leads to be exposed from the package encapsulant. In this way, the connecting pads of the carrier can be used to increase electrical input/output (I/O) connections of the chip, without the need of providing additional leads in the die pad as in the conventional technology. Consequently, the undesirable increase in the complexity of fabrication processes due to the need of performing a deflash process for removing resin flash incurred in a molding process as in the conventional technology, can be eliminated in the present invention. Further, the undesirable increase in the complexity of fabrication processes and the fabrication cost due to the need of a separation process for the additional leads as in the conventional technology, can be eliminated in the present invention. Moreover, the degraded bonding in the semiconductor package due to cracks and moisture invading (caused by insufficient encapsulating of the package encapsulant after separation of the additional leads) and due to ineffective wetting of a solder material (caused by oxidation) as in the conventional technology, can be avoided in the present invention.

Second Embodiment

Figure 4A:
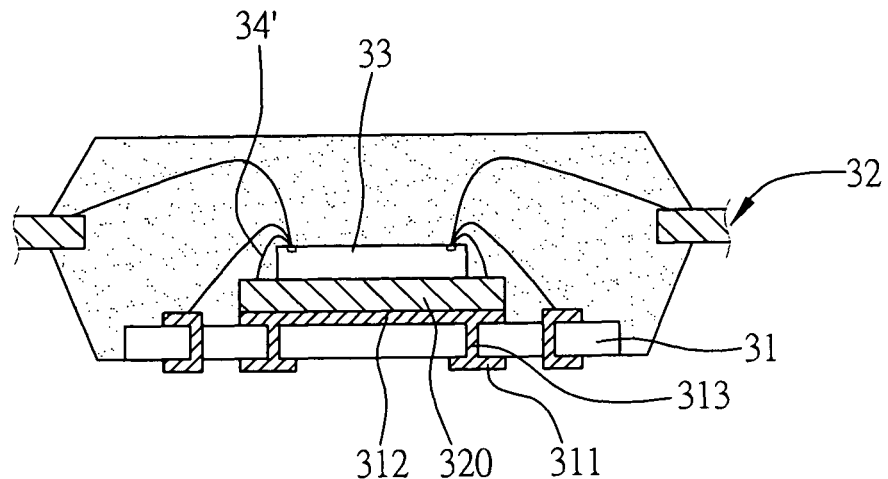
FIGS. 4A to 4C are schematic diagrams showing a semiconductor package and a manufacturing method thereof in accordance with a second embodiment of the present invention.
Figure 4B:
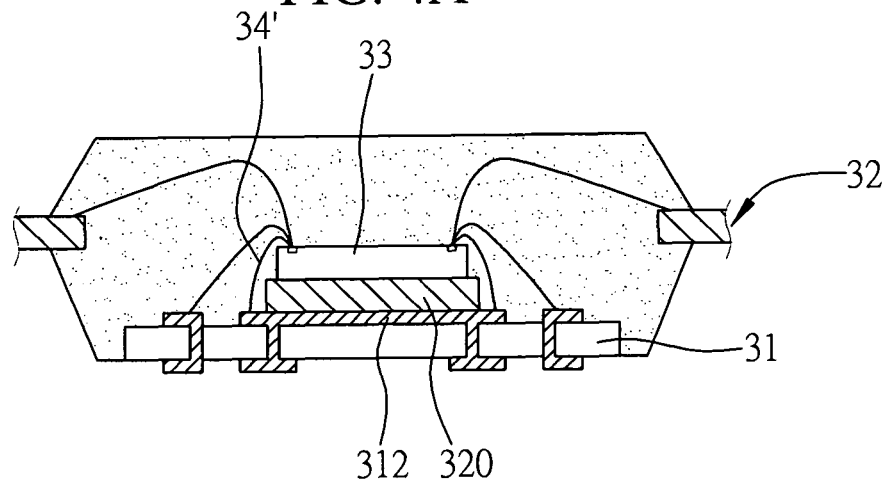
Figure 4C:
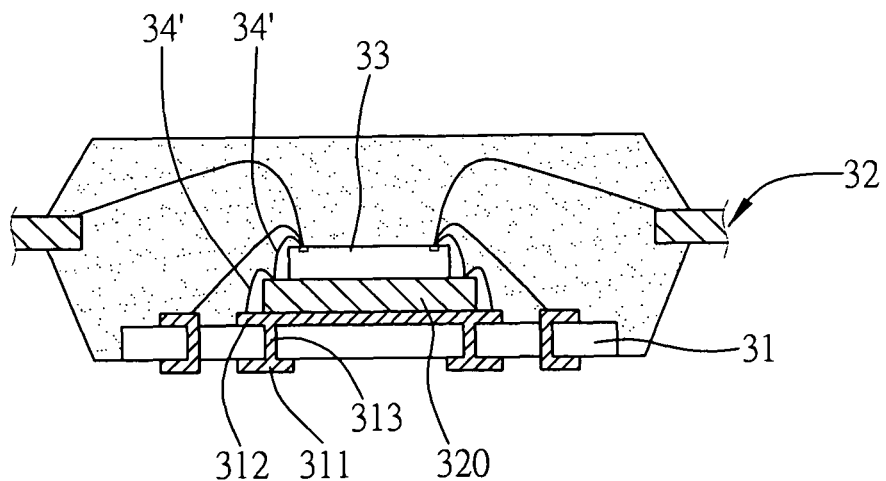

FIGS. 4A to 4C illustrate a semiconductor package and a manufacturing method thereof in accordance with a second embodiment of the present invention, wherein identical or similar reference numerals are used here for identical or similar components with respect to the above embodiment for the sake of brevity and clarity.

The semiconductor package in this second embodiment is similar to that of the above embodiment, with a primary difference in that the second embodiment provides the semiconductor chip with a grounding function, thereby further enhancing the electrical performance of the package.

As shown in FIG. 4A, the semiconductor chip 33 is electrically connected to the die pad 320 of the leadframe 32 via grounding wires 34', and then is electrically connected to the connecting pads 311 through the attaching pad 312 on the carrier 31 and the conductive structures 313.

Alternatively, as shown in FIG. 4B, the planar size of the attaching pad 312 of the carrier 31 is larger than that of the die pad 320 of the leadframe 32, so as to allow the semiconductor chip 33 to be electrically connected via the grounding wires 34' to the attaching pad 312 that is exposed from the die pad 320.

Alternatively, as shown in FIG. 4C, the semiconductor chip 33 is electrically connected to the die pad 320 of the leadframe 32 via the grounding wires 34', and then the die pad 320 is electrically connected to the attaching pad 312 of the carrier 31 via other grounding wires 34', allowing further electrical connection to the connecting pads 311 via the conductive structures 313 and to an external device (such as a printed circuit board, not shown) so as to enhance the electrical performance of the package.

Third Embodiment

Figure 5:
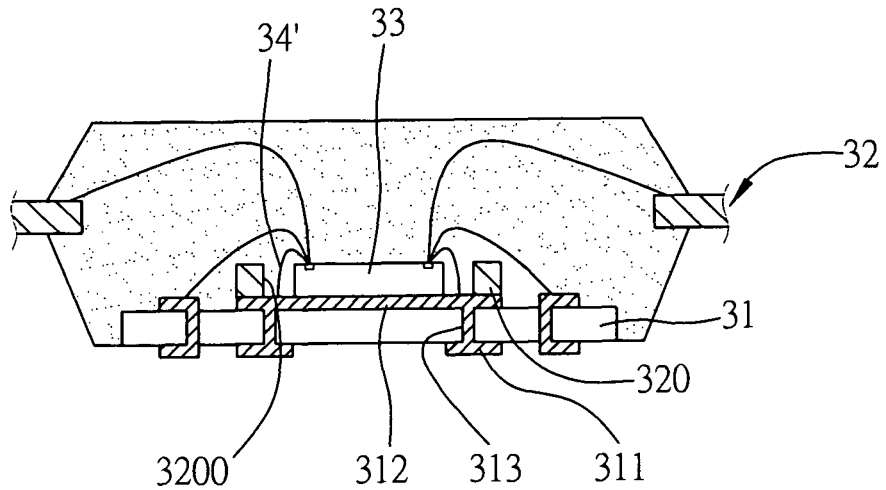
FIG. 5 is a schematic diagram showing a semiconductor package and a manufacturing method thereof in accordance with a third embodiment of the present invention.

FIG. 5 illustrates a semiconductor package and a manufacturing method thereof in accordance with a third embodiment of the present invention, wherein identical or similar reference numerals are used here for identical or similar components with respect to the above embodiments for the sake of brevity and clarity.

The semiconductor package in this third embodiment is similar to that of the above embodiments, with a primary difference in that an opening 3200 is formed in the die pad 320 of the leadframe 32, allowing the semiconductor chip 33 to be placed in the opening 3200 and attached to the attaching pad 312 of the carrier 31.

Moreover, the semiconductor chip 33 can be electrically connected via grounding wires 34' to the attaching pad 312 exposed within the opening 3200 of the die pad 320. The attaching pad 312 is primarily made of copper and plated with a metal layer (such as a nickel/gold layer) for connecting the bonding wires. Further, the attaching pad 312 can be electrically connected to the connecting pads 311 on the bottom surface of the carrier 31 via the conductive structures 313 formed in the carrier 31.

Fourth Embodiment

Figure 6:
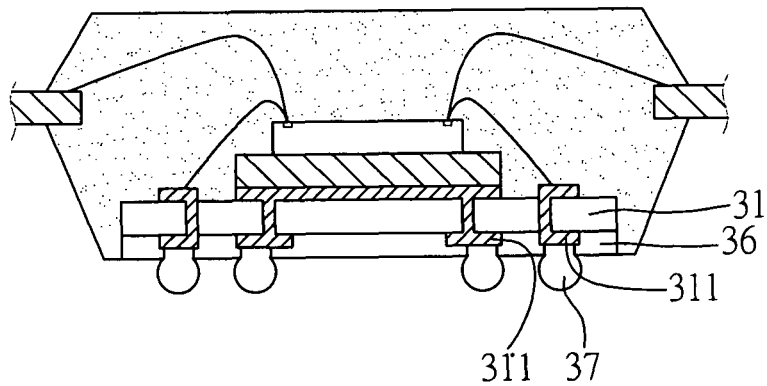
FIG. 6 is a schematic diagram showing a semiconductor package and a manufacturing method thereof in accordance with a fourth embodiment of the present invention.

FIG. 6 illustrates a semiconductor package and a manufacturing method thereof in accordance with a fourth embodiment of the present invention, wherein identical or similar reference numerals are used here for identical or similar components with respect to the above embodiments for the sake of brevity and clarity.

The semiconductor package in this fourth embodiment is similar to that of the above embodiments, with a primary difference in that the bottom surface of the carrier 31 is covered by a soldermask layer 36. The soldermask layer 36 is formed with a plurality of openings for exposing the connecting pad 311 of the carrier 31, and conductive components 37 are mounted to the exposed connecting pads 311, so as to provide a high density of electrical I/O connections. Moreover, the conductive components 37 allow the package to be more easily electrically connected to an external device (such as printed circuit board, PCB).

Fifth Embodiment

Figure 7:
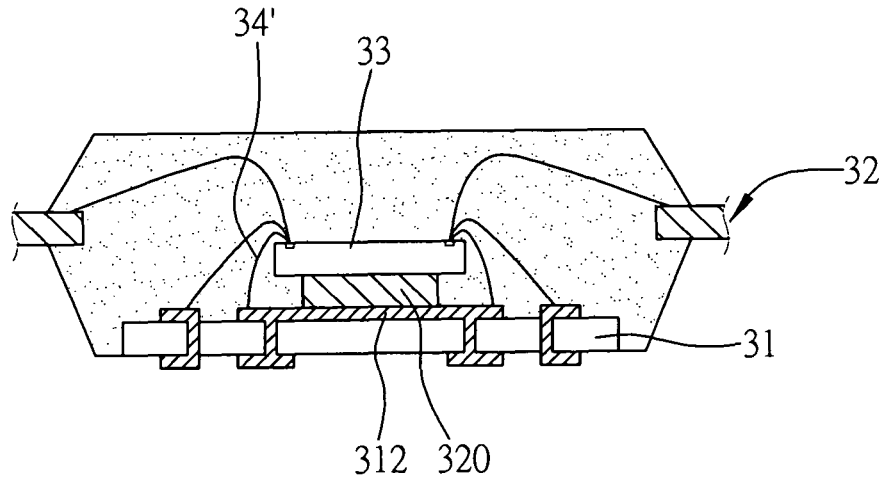
FIG. 7 is a schematic diagram showing a semiconductor package and a manufacturing method thereof in accordance with a fifth embodiment of the present invention.

FIG. 7 illustrates a semiconductor package and a manufacturing method thereof in accordance with a fifth embodiment of the present invention, wherein identical or similar reference numerals are used here for identical or similar components with respect to the above embodiments for the sake of brevity and clarity.

The semiconductor package in this fifth embodiment is similar to that of the above embodiments, with a primary difference in that the planar size of the die pad 320 of the leadframe 32 can be made smaller than that of the semiconductor chip 33 in order to reduce the contact area between the semiconductor chip 33 and the die pad 320, thereby preventing delamination between the semiconductor chip 33 and the die pad 320 due to their mismatch in coefficient of thermal expansion (CTE) and thermal stress. Further, the semiconductor chip 33 is allowed to be electrically connected to the attaching pad 312 of the carrier 31 via grounding wires 34', so as to enhance the electrical performance of the package.

Sixth Embodiment

Figure 8:
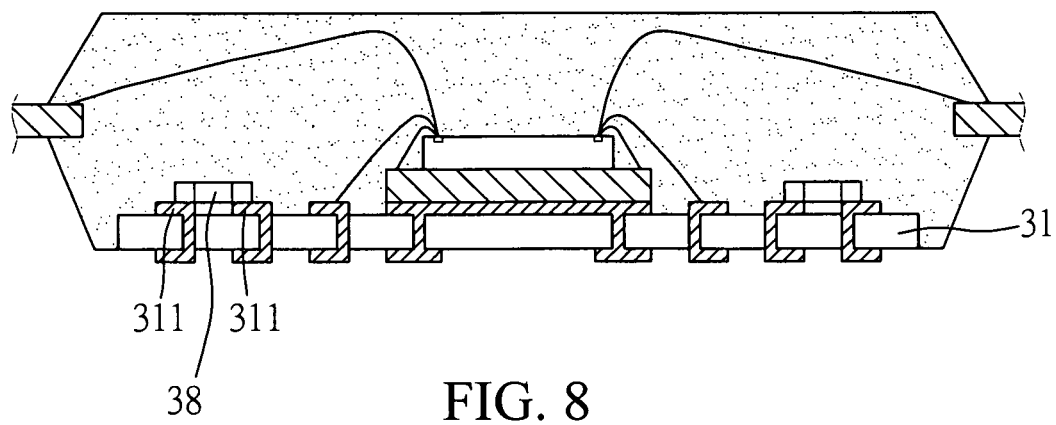
FIG. 8 is a schematic diagram showing a semiconductor package and a manufacturing method thereof in accordance with a sixth embodiment of the present invention.

FIG. 8 illustrates a semiconductor package and a manufacturing method thereof in accordance with a sixth embodiment of the present invention, wherein identical or similar reference numerals are used here for identical or similar components with respect to the above embodiments for the sake of brevity and clarity.

The semiconductor package in this sixth embodiment is similar to that of the above embodiments, with a primary difference in that passive components 38 are attached to and electrically connected to the connecting pads 311 on the top surface of the carrier 31, so as to enhance the electrical functionality and performance of the package.

Seventh Embodiment

Figure 9:
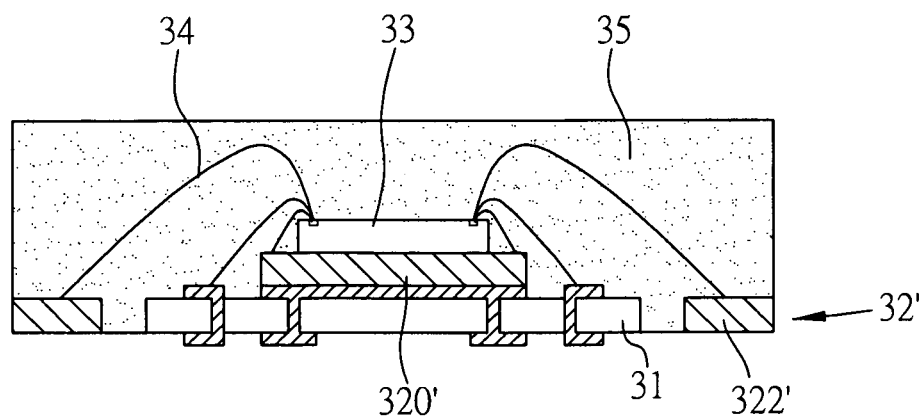
FIG. 9 is a schematic diagram showing a semiconductor package and a manufacturing method thereof in accordance with a seventh embodiment of the present invention.

FIG. 9 illustrates a semiconductor package and a manufacturing method thereof in accordance with a seventh embodiment of the present invention, wherein identical or similar reference numerals are used here for identical or similar components with respect to the above embodiments for the sake of brevity and clarity.

The semiconductor package in this seventh embodiment is generally the same as that of the above embodiments, with a primary difference in that a quad flat non-leaded leadframe 32' is used, and a die pad 320' is attached to the carrier 31. Additionally, the bottom surface of the carrier 31 and bottom surfaces of leads 322' of the quad flat non-leaded leadframe 32' are substantially coplanar with each other. The, chip attachment, wire bonding and molding processes are performed, and the package encapsulant 35 is formed to encapsulate the semiconductor chip 33, the bonding wires 34, the leadframe 32' and the carrier 31, with the bottom surface of the carrier 31 and the bottom surfaces of the leads 322' of the quad flat non-leaded leadframe 32' being exposed from the package encapsulant 35.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A semiconductor package, comprising:
a leadframe comprising a die pad and a plurality of leads surrounding the die pad, the die pad having a top surface and an opposing bottom surface, and an opening being formed in the die pad;
a carrier mounted to the bottom surface of the die pad, wherein a plurality of connecting pads are formed on the carrier, and a planar size of the carrier is greater than that of the die pad, allowing the connecting pads on a top surface of the carrier to be exposed from the die pad, wherein the leads are entirely located outside a vertical-forward projected area of the carrier, and the leads are free from being located inside the vertical-forward projected area of the carrier and free from contacting the carrier;
at least a semiconductor chip attached to a side of an assembly comprising the die pad and the carrier, and electrically connected to the connecting pads of the carrier and the leads of the leadframe via bonding wires, wherein the semiconductor chip is placed in the opening of the die pad; and
a package encapsulant encapsulating the semiconductor chip, the bonding wires, a part of the carrier and a part of the leadframe, allowing a bottom surface of the carrier and a part of the leads to be exposed from the package encapsulant.

2. The semiconductor package of claim 1, wherein the plurality of connecting pads are formed on the top and bottom surfaces of the carrier, and the connecting pads on the top surface of the carrier are electrically connected to the bottom surface of the carrier via conductive structures formed in the carrier.

3. The semiconductor package of claim 1, wherein an attaching pad is formed on the top surface of the carrier, allowing the die pad of the leadframe to be attached to the attaching pad.

4. The semiconductor package of claim 3, wherein the attaching pad is electrically connected to the connecting pads on the bottom surface of the carrier via conductive structures formed in the carrier.

5. The semiconductor package of claim 3, wherein the semiconductor chip is electrically connected to one of the die pad and the attaching pad via at least a grounding wire.

6. The semiconductor package of claim 3, wherein the semiconductor chip is electrically connected to the die pad via at least a grounding wire, and the die pad is electrically connected to the attaching pad via at least another grounding wire.

7. The semiconductor package of claim 3, wherein a planar size of the die pad of the leadframe is smaller than that of the semiconductor chip, and the semiconductor chip is electrically connected to the attaching pad of the carrier via at least a grounding wire.

8. The semiconductor package of claim 1, wherein a distance between bottom surfaces of the leads of the leadframe and the bottom surface of the carrier is greater than a depth of a cavity of a mold for forming the package encapsulant.

9. The semiconductor package of claim 1, wherein the semiconductor chip is attached to the top surface of the die pad.

10. The semiconductor package of claim 1, wherein the semiconductor chip is attached to the top surface of the carrier.

11. The semiconductor package of claim 10, wherein an attaching pad is formed on the top surface of the carrier, allowing the semiconductor chip to be attached to the attaching pad exposed within the opening of the die pad.

12. The semiconductor package of claim 11, wherein the semiconductor chip is electrically connected via at least a grounding wire to the attaching pad exposed within the opening of the die pad.

13. The semiconductor package of claim 1, wherein the carrier is covered with a soldermask layer, and the soldermask layer is formed with openings for exposing the connecting pads, allowing conductive components to be mounted to the connecting pads exposed within the openings of the soldermask layer.

14. The semiconductor package of claim 1, wherein passive components are attached to and electrically connected to the connecting pads on the top surface of the carrier.

15. A semiconductor package, comprising:
a leadframe comprising a die pad and a plurality of leads surrounding the die pad, the die pad having a top surface and an opposing bottom surface, and an opening being formed in the die pad;
a carrier mounted to the bottom surface of the die pad, wherein a plurality of connecting pads are formed on the carrier, and a planar size of the carrier is greater than that of the die pad, allowing the connecting pads on a top surface of the carrier to be exposed from the die pad, wherein a bottom surface of the carrier is substantially flush with bottom surfaces of the leads, wherein the leads are entirely located outside a vertical-forward projected area of the carrier, and the leads are free from being located inside the vertical-forward projected area and free from contacting the carrier;
at least a semiconductor chip attached to a side of an assembly comprising the die pad and the carrier, and electrically connected to the connecting pads of the carrier and the leads of the leadframe via bonding wires, wherein the semiconductor chip is placed in the opening of the die pad; and
a package encapsulant encapsulating the semiconductor chip, the bonding wires, a part of the carrier and a part of the leadframe, allowing the bottom surface of the carrier and the bottom surfaces of the leads to be exposed from the package encapsulant.

16. The semiconductor package of claim 15, wherein the leadframe is a quad flat non-leaded leadframe.

17. The semiconductor package of claim 15, wherein the plurality of connecting pads are formed on the top and bottom surfaces of the carrier, and the connecting pads on the top surface of the carrier are electrically connected to the connecting pads on the bottom surface of the carrier via conductive structures formed in the carrier.

18. The semiconductor package of claim 15, wherein an attaching pad is formed on the top surface of the carrier, allowing the die pad of the leadframe to be attached to the attaching pad.

19. The semiconductor package of claim 18, wherein the attaching pad is electrically connected to the connecting pads on the bottom surface of the carrier via conductive structures formed in the carrier.

20. The semiconductor package of claim 18, wherein the semiconductor chip is electrically connected to one of the die pad and the attaching pad via at least a grounding wire.

21. The semiconductor package of claim 18, wherein the semiconductor chip is electrically connected to the die pad via at least a grounding wire, and the die pad is electrically connected to the attaching pad via at least another grounding wire.

22. The semiconductor package of claim 18, wherein a planar size of the die pad of the leadframe is smaller than that of the semiconductor chip, and the semiconductor chip is electrically connected to the attaching pad of the carrier via at least a grounding wire.

23. The semiconductor package of claim 15, wherein the semiconductor chip is attached to the top surface of the die pad.

24. The semiconductor package of claim 15, wherein the semiconductor chip is attached to the top surface of the carrier.

25. The semiconductor package of claim 24, wherein an attaching pad is formed on the top surface of the carrier, allowing the semiconductor chip to be attached to the attaching pad exposed within the opening of the die pad.

26. The semiconductor package of claim 25, wherein the semiconductor chip is electrically connected via at least a grounding wire to the attaching pad exposed within the opening of the die pad.

27. The semiconductor package of claim 15, wherein the carrier is covered with a soldermask layer, and the soldermask layer is formed with openings for exposing the connecting pads, allowing conductive components to be mounted to the connecting pads exposed within the openings of the soldermask layer.

28. The semiconductor package of claim 15, wherein passive components are attached to and electrically connected to the connecting pad on the top surface of the carrier.

\* \* \* \* \*